US012635256B2

(12) United States Patent　　　(10) Patent No.:　US 12,635,256 B2
Galy　　　　　　　　　　　　　　　(45) Date of Patent:　　　May 19, 2026

(54) PASSIVE ELECTROSTATIC-DISCHARGE SENSOR AND METHOD FOR DETECTING ELECTROSTATIC DISCHARGES

(71) Applicant: STMicroelectronics France, Montrouge (FR)

(72) Inventor: Philippe Galy, Le Touvet (FR)

(73) Assignee: STMicroelectronics France, Montrouge (FR)

( * ) Notice: Subject to any disclaimer, the term of this patent is extended or adjusted under 35 U.S.C. 154(b) by 973 days.

(21) Appl. No.: 17/748,311

(22) Filed: May 19, 2022

(65) Prior Publication Data

US 2022/0384419 A1　　Dec. 1, 2022

(30) Foreign Application Priority Data

May 25, 2021　(FR) ...................................... 2105435

(51) Int. Cl.
H10D 89/60　　　(2025.01)
H01L 23/66　　　(2006.01)
(52) U.S. Cl.
CPC ........... H10D 89/811 (2025.01); H01L 23/66 (2013.01); H10D 89/921 (2025.01); *H01L 2223/6677* (2013.01)
(58) Field of Classification Search
CPC .... H10D 64/62; H10D 30/43; H10D 30/6735; H10D 62/121; H10D 84/017; H10D 84/0186; H10D 84/038; H10D 84/85; H10D 62/151; H10D 62/822; H10D 89/811; H10D 89/921; H10D 89/601; H01L 23/66; H01L 2223/6677
See application file for complete search history.

(56) References Cited

U.S. PATENT DOCUMENTS

| | | | | |
|---|---|---|---|---|
| 5,933,741 A | * | 8/1999 | Tseng | ................ H01L 21/28061 |
| | | | | 257/E21.2 |
| 6,417,544 B1 | * | 7/2002 | Jun | ...................... H10D 89/611 |
| | | | | 438/237 |
| 6,902,959 B2 | | 6/2005 | Kim et al. | |

(Continued)

FOREIGN PATENT DOCUMENTS

| | | |
|---|---|---|
| CN | 107316871 A | 11/2017 |
| CN | 218498072 U | 2/2023 |
| JP | 2018041899 A | 3/2018 |

OTHER PUBLICATIONS

INPI Search Report and Written Opinion for priority application, FR 2105435, report dated Feb. 2, 2022, 8 pgs.

(Continued)

*Primary Examiner* — Caleb E Henry
(74) *Attorney, Agent, or Firm* — Crowe & Dunlevy LLC

(57)　　　　　　ABSTRACT

An integrated circuit is formed by a semiconductor part with a semiconductor substrate and an interconnection part including levels of metals. An electrostatic-discharge sensor includes a semiconductor structure in the semiconductor part and a network of metal antennas in the interconnection part. The electrostatic-discharge sensor has at least one pair of two nodes having one of a resistive link or a capacitive link or a PN-junction link in the semiconductor structure. The antennas of the network of antennas coupled to the nodes of the least one pair of two nodes exhibit an asymmetry in one or more of shape and size.

31 Claims, 6 Drawing Sheets

(56) References Cited

U.S. PATENT DOCUMENTS

| | | | | |
|---|---|---|---|---|
| 7,067,886 | B2* | 6/2006 | Bonges, III | H10D 89/601 |
| | | | | 257/362 |
| 7,493,152 | B1* | 2/2009 | Fifield | H04B 7/061 |
| | | | | 455/552.1 |
| 7,504,721 | B2* | 3/2009 | Chen | H01L 25/16 |
| | | | | 257/691 |
| 7,760,144 | B2* | 7/2010 | Chang | H01L 23/66 |
| | | | | 343/702 |
| 8,514,532 | B2* | 8/2013 | Worley | H02H 9/046 |
| | | | | 361/111 |
| 8,581,356 | B2* | 11/2013 | Pennock | H10D 8/00 |
| | | | | 257/E29.326 |
| 8,624,381 | B2* | 1/2014 | Lachner | H01L 23/66 |
| | | | | 257/E23.129 |
| 9,153,544 | B2* | 10/2015 | Pagaila | H01L 23/60 |
| 9,490,245 | B1* | 11/2016 | Sahu | H10D 89/811 |
| 9,754,966 | B1* | 9/2017 | Yuan | H10D 62/106 |
| 10,109,998 | B2* | 10/2018 | Altaras | H02H 9/04 |
| 10,734,806 | B2* | 8/2020 | Zhao | H02H 9/046 |
| 10,931,101 | B2* | 2/2021 | Wu | H02H 3/207 |
| 2002/0094625 | A1 | 7/2002 | Hashimoto et al. | |
| 2005/0093072 | A1 | 5/2005 | Bonges, III et al. | |
| 2007/0063056 | A1* | 3/2007 | Gaucher | H01L 24/73 |
| | | | | 257/679 |
| 2009/0166849 | A1* | 7/2009 | Jao | H01L 23/4334 |
| | | | | 257/E21.507 |
| 2009/0289341 | A1* | 11/2009 | Yamazaki | H10D 86/80 |
| | | | | 257/679 |
| 2010/0008620 | A1 | 1/2010 | Chang et al. | |
| 2010/0026601 | A1* | 2/2010 | Chang | H01Q 23/00 |
| | | | | 343/834 |
| 2011/0002076 | A1 | 1/2011 | Sakai | |
| 2012/0074538 | A1* | 3/2012 | Tsai | H01L 23/3121 |
| | | | | 257/659 |
| 2013/0207274 | A1* | 8/2013 | Liu | H01L 23/66 |
| | | | | 257/774 |
| 2015/0043113 | A1* | 2/2015 | Yang | H02H 9/046 |
| | | | | 361/56 |
| 2016/0020524 | A1* | 1/2016 | Carpentier | H01L 23/49816 |
| | | | | 343/834 |
| 2016/0126220 | A1* | 5/2016 | Chen | H01L 25/50 |
| | | | | 257/737 |
| 2016/0248145 | A1* | 8/2016 | Ritter | H01Q 21/28 |
| 2017/0092625 | A1* | 3/2017 | Pagani | H10D 1/20 |
| 2017/0155243 | A1* | 6/2017 | Tan | H02H 9/046 |
| 2017/0162524 | A1* | 6/2017 | Wang | H01L 23/66 |
| 2017/0221879 | A1* | 8/2017 | Wang | H10D 89/911 |
| 2017/0243788 | A1* | 8/2017 | Shimbo | H10D 89/611 |
| 2017/0345815 | A1* | 11/2017 | Ashimine | H01L 23/5228 |
| 2018/0024187 | A1* | 1/2018 | Tatsumi | G01R 31/2853 |
| | | | | 361/118 |
| 2018/0025999 | A1* | 1/2018 | Yu | H01L 23/485 |
| | | | | 257/428 |
| 2018/0212422 | A1* | 7/2018 | Wu | H02H 9/04 |
| 2019/0237459 | A1 | 8/2019 | Hiura | |
| 2020/0006259 | A1* | 1/2020 | Huang | H01L 21/56 |
| 2020/0135716 | A1* | 4/2020 | Kim | H10D 84/0188 |
| 2021/0280959 | A1* | 9/2021 | Han | H01Q 1/36 |
| 2022/0293560 | A1* | 9/2022 | Chen | H01L 24/19 |
| 2022/0344930 | A1* | 10/2022 | Sun | H02H 9/046 |

OTHER PUBLICATIONS

CN First Office Action and Search Report for counterpart CN Appl. No. 202210575127.0, report dated Nov. 27, 2025, 6 pgs.

* cited by examiner

500

(V)

(A)

LRpoly

NG1

B

G

NG2

PASSIVE ELECTROSTATIC-DISCHARGE SENSOR AND METHOD FOR DETECTING ELECTROSTATIC DISCHARGES

PRIORITY CLAIM

This application claims the priority benefit of French Application for Patent No. 2105435, filed on May 25, 2021, the content of which is hereby incorporated by reference in its entirety to the maximum extent allowable by law.

TECHNICAL FIELD

Implementations and embodiments relate to integrated circuits and, in particular, to integrated circuits including an electrostatic-discharge sensor.

BACKGROUND

Electrostatic discharges (ESDs) can occur during the steps of manufacturing integrated circuits and degrade the components of the integrated circuits. For example, methods for plasma etching can create electric charges on the physical nodes of a device of the integrated circuit, for example a Metal Oxide Semiconductor (MOS) transistor. The accumulations of electrostatic discharges on the physical nodes of the device can create a difference in potential between these nodes, which can cause degradations (breakdowns) of the materials present between said nodes during an electrostatic discharge.

This type of degradation is largely random and it is desirable to be able to detect, identify and quantify the phenomena of electrostatic discharges, for example during a phase of testing and characterizing the products.

Thus, methods for quantifying the risk of the integrated circuits being damaged by electrostatic discharges, for example according to the charged device model (CDM), can comprise phases in which the nodes of the device are charged to a given voltage, then discharged. According to the discharge dynamics of the various nodes, it is possible for differences in potential between two nodes to produce degradations due to electrostatic discharges.

Here again, it is desirable to be able to detect, identify and quantify the phenomena of electrostatic discharges.

There are conventional preventive solutions to the problems of electrostatic discharges, allowing for example to locally evacuate the electrostatic discharges via dedicated diodes. That being said, this type of preventive and local solution does not allow to identify and quantify the electrostatic discharges.

Conventional detection solutions can allow to identify a degradation occurring in a test device but are generally not very sensitive and have few possible measurements. For example, when the test device is a MOS transistor, a breakdown of the gate oxide can be detected but a degradation of the conductive regions or of the gate region alone cannot be measured. Consequently, the characteristics of the components of the integrated circuit can deviate individually in a slight and non-identifiable manner but significantly over the overall product (such a deviation is usually called a "corner effect"), without a conventional solution to detect them.

There is accordingly a need in the art for integrated circuits equipped with an electrostatic-discharge sensor capable of detecting various types of degradations and deviations in characteristics, with an increased sensitivity.

SUMMARY

According to one aspect, in this respect an integrated circuit is proposed comprising a semiconductor part including a semiconductor substrate, an interconnection part including levels of metals, and an electrostatic-discharge sensor including a semiconductor structure in the semiconductor part and a network of metal antennas in the interconnection part, the sensor including at least one pair of two nodes having a resistive link or a capacitive link or a PN-junction link in the semiconductor structure, and antennas of the network of antennas having an asymmetry in shape and/or in size, respectively connected to said nodes of each pair. The asymmetries in shape and in size of the antennas respectively connected to the two nodes of each pair of the sensor allow to amplify a difference in the accumulation of electrostatic charges on the physical nodes of the sensor, and thus to amplify the difference in potential between these nodes, which can produce degradations of the materials present between said nodes during an electrostatic discharge.

Analogously, the asymmetries in shape and in size of the antennas can amplify a difference in the discharge dynamics of the nodes of the corresponding pair, consequently amplifying the difference in potentials occurring during a discharge of said nodes, which can produce degradations of the materials present between said nodes by electrostatic discharge.

Consequently, phenomena causing relatively weak electrostatic discharges (differences in accumulation of charges or in discharge dynamics) are amplified and detectable by the degradation of the materials present between the nodes of the pairs of the sensor. The relatively weak electrostatic discharges are electrostatic discharges that can cause a deviation in the characteristics of a link without observable deterioration. Thus, the sensor proposed according to this aspect has an increased sensitivity.

Moreover, the various types of links between the nodes of the various possible pairs of the sensor allow to have a multitude of measurements, which can be representative of various phenomena that generate electrostatic discharges. For example, one node can be dedicated to a single pair of two nodes having a given link (resistive, capacitive, PN junction) between them, or can on the contrary belong to several pairs of two nodes having various links, distinct or not, (resistive, capacitive, PN junction) between them.

According to one implementation, the antennas respectively connected to the nodes of each pair have an asymmetry in size in that the ratio of their surface areas is greater than or equal to ten. Indeed, the difference (asymmetry) in size between the two antennas connected to the two nodes of a pair of the sensor introduces a difference, substantially proportional, between the accumulations of electric charges on the two nodes of the pair. The size of the antennas also affects the discharge dynamics of the nodes of the pair.

According to one implementation, the antennas respectively connected to the nodes of each pair have an asymmetry in shape in that one has the shape of a rake including branches adapted to run through several surface units in the respective level of metal, while the other has the shape of a plate only covering one surface unit in the respective level of metal.

Indeed, the rake shape runs through a greater stretch than the plate shape, which allows to accumulate electric charges in various zones, more globally than the local position of the plate. Thus, the difference (asymmetry) in shape between the two antennas connected to the two nodes of a pair of the sensor introduces here also a difference between the accumulations of electric charges on the two nodes of the pair.

According to one implementation, the integrated circuit includes several electrostatic-discharge sensors, the network of antennas of each sensor being located in a respective level of metal. This allows, for example, to identify whether one level of metal is more likely to cause electrostatic discharges than another.

According to one implementation, the semiconductor structure includes a bar of polycrystalline silicon located on a front face of the semiconductor substrate.

According to one implementation, said at least one pair of the sensor includes a pair of two nodes having a resistive link, the bar of polycrystalline silicon forming the resistive link between the nodes of said pair.

According to one implementation, a dielectric layer is located between the bar of polycrystalline silicon and the semiconductor substrate, said at least one pair of the sensor including a pair of two nodes having a capacitive link, the superposition of the bar of polycrystalline silicon, of the dielectric layer and of the semiconductor substrate forming the capacitive link between the nodes of said pair.

According to one implementation, the semiconductor structure includes at least one doped region in the semiconductor substrate.

According to one implementation, said at least one doped region includes a surface layer of a semi-metallic compound, said at least one pair of the sensor including a pair of two nodes having a resistive link, the surface layer of metal compound forming the resistive link between the nodes of said pair.

A semi-metallic compound, also called intermetallic compound, is an association of a metal material and of a semiconductor material by a chemical bond, for example such as the metal silicides, typically the silicide of copper or of tungsten.

According to one implementation, the semiconductor structure includes a first doped region of a first type in the semiconductor substrate and a second doped region of a second type opposite to the first in the semiconductor substrate, said at least one pair of the sensor including a pair of two nodes having a PN junction link, an interface between the first doped region and the second doped region forming the PN-junction link between the nodes of said pair.

According to one implementation, the semiconductor structure includes a buried oxide region between the semiconductor substrate and a carrier substrate, said at least one pair of the sensor including a pair of two nodes having a capacitive link, the superposition of the semiconductor substrate, of the buried oxide region and of the carrier substrate forming the capacitive link between the nodes of said pair.

This corresponds to a substrate of the Silicon On Insulator (SOI) type in which the capacitive interface between the carrier substrate, called a "back gate", and the semiconductor substrate is used as a capacitive link between the nodes of a pair of the sensor.

According to another aspect, a method is proposed for detecting an electrostatic discharge comprising a manufacturing of an integrated circuit as defined above, and a measurement step comprising a characterization of the link between the nodes of said at least one pair, and a decision step comprising a comparison between the measured characterization and a nominal characteristic of the corresponding resistive, capacitive, or PN-junction link. According to one embodiment, the manufacturing of the levels of metals comprises an exposure of the antenna network to an electrically charged plasma environment.

According to one embodiment, the manufacturing of the electrostatic-discharge sensor is carried out simultaneously to a manufacturing of other elements of the integrated circuit, and wherein the decision step comprises, in the case of a divergence between the measured characterization and a nominal characteristic of the corresponding link, an evaluation of the damage caused in the other elements of the integrated circuit on the basis of the divergence and the asymmetry in size and/or in shape of the antenna coupled to the nodes of the corresponding pair.

BRIEF DESCRIPTION OF THE DRAWINGS

Other advantages and features of the invention will appear upon examining the detailed description of implementations and embodiments, in no way limiting, and the appended drawings, in which:

FIGS. 4 to 7 illustrate examples of links between the two nodes of "individual" pairs of an electrostatic-discharge detector, as well as an electric characteristic of the respective links; and FIG. 8 illustrates a method for detecting an electrostatic discharge.

DETAILED DESCRIPTION

Figure 1:
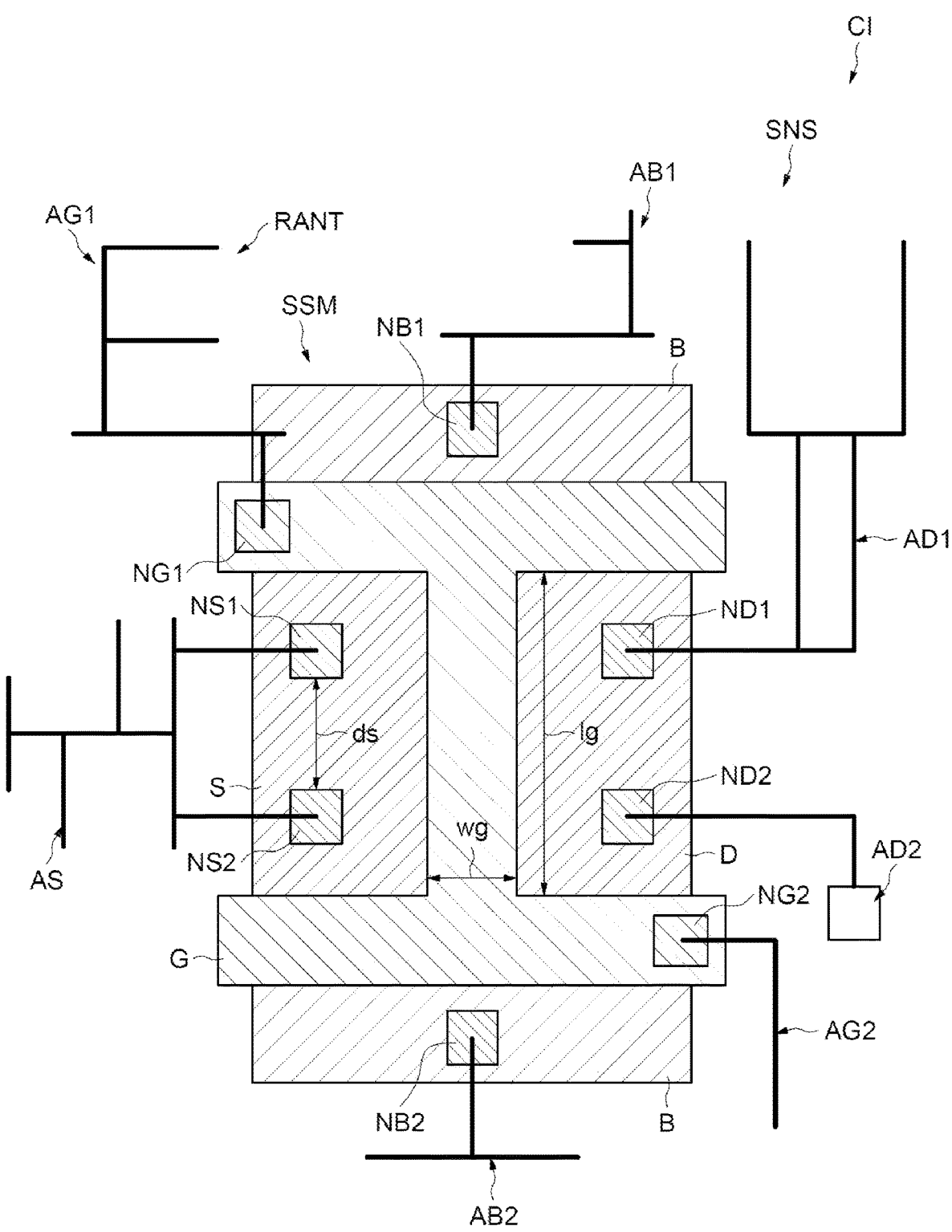
FIGS. 1 and 2 illustrate an example of an electrostatic-discharge sensor.
Figure 2:
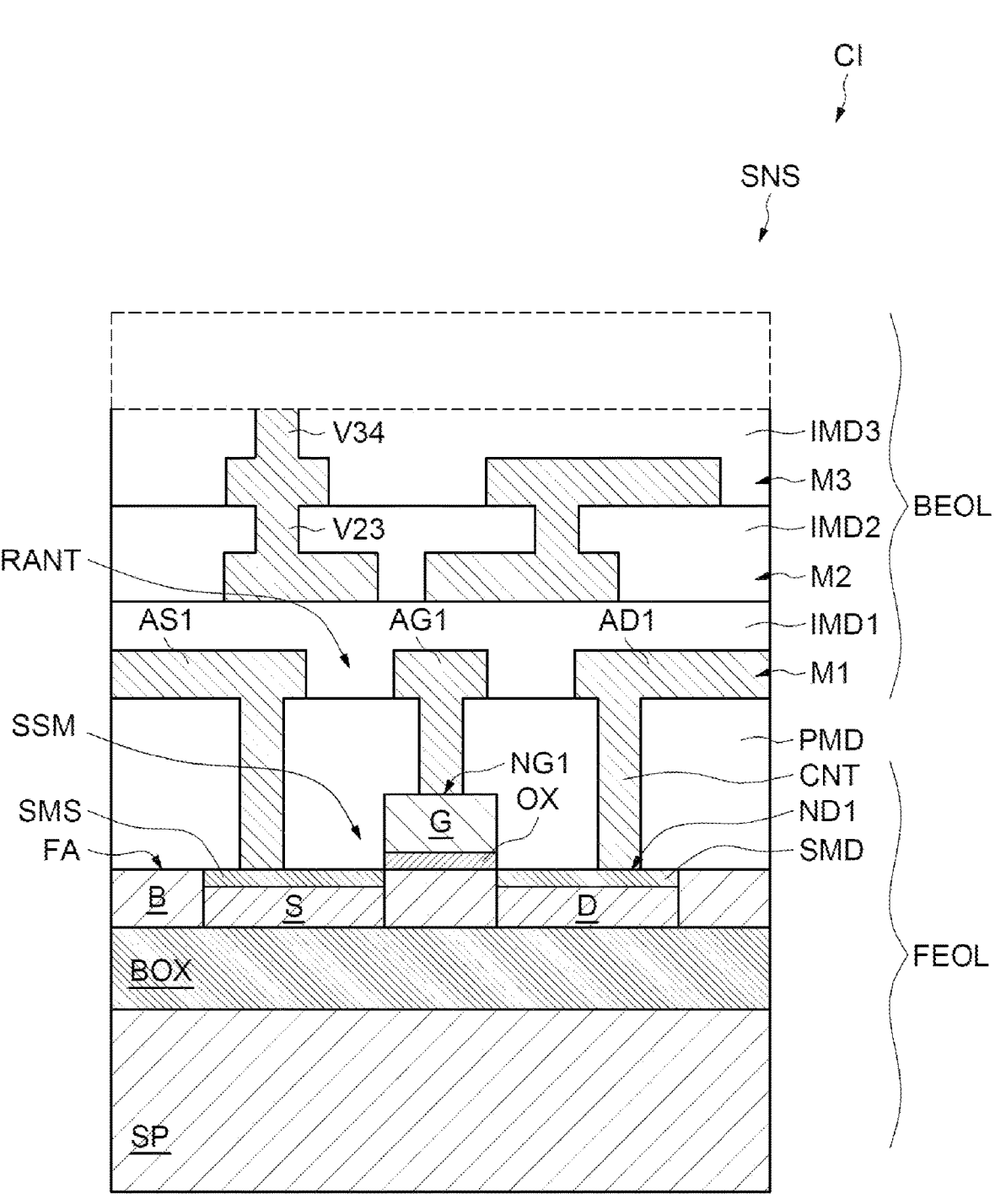

FIGS. 1 and 2 illustrate an example of an electrostatic-discharge sensor SNS belonging to an integrated circuit CI.

FIG. 1 corresponds to a top view of the sensor SNS, at a front face FA of a semiconductor substrate, belonging to a semiconductor part of the integrated circuit CI called and labelled as Front End Of Line FEOL. Moreover, an antenna network RANT of the sensor SNS, located in a plane parallel to that of the front face FA, is schematically shown also in a top view.

FIG. 2 corresponds to a cross-sectional view of the sensor SNS, showing the semiconductor part FEOL and an interconnection part of the integrated circuit CI called and labelled as Back End Of Line BEOL.

The sensor SNS is a sensor of the passive type, that is to say that it is not intended to function when the integrated circuit is powered and operating, but is intended to undergo possible electrostatic discharges that can modify the structure of the sensor SNS. The structural modifications are then observed in order to deduce and characterize the electrostatic discharges that occurred in the integrated circuit CI.

The electrostatic-discharge sensor SNS includes a semiconductor structure SSM, made in the semiconductor part FEOL of the integrated circuit, and a network of metal antennas RANT, made in one or more level(s) of metal M1 of the interconnection part BEOL.

The semiconductor structure SSM is intended to undergo the structural modifications for the detection of the electrostatic discharges, while the network of antennas RANT is intended to collect the electric charges or to influence the discharge dynamics of a node, to generate electrostatic discharges in the semiconductor structure SSM.

The sensor includes in this respect at least one pair of two nodes ND1, NS1, NG1, NB1, ND2, NS2, NG2, NB2 having a resistive link or a capacitive link or a PN-junction link in the semiconductor structure SSM, the antennas AD1, AS1, AG1, AB1, AD2, AS2, AG2, AB2 of the network of antennas RANT being connected to each node of the semiconductor structure SSM.

The antennas of the network of antennas RANT are connected to the respective nodes via conventional contact pillars CNT, passing through a layer of pre-metal dielectric PMD located between the semiconductor part FEOL and the interconnection part BEOL. The front face FA of the semiconductor substrate is defined as the face where the pre-metal dielectric layer PMD is located, that is to say the face on which the components of the semiconductor part FEOL are made.

The network of antennas RANT of the sensor SNS can be formed in a single level of metal, for example the first level of metal M1, or in several levels of metals.

The levels of metals M1, M2, M3 are separated vertically by inter-metal dielectric layers IMD1, IMD2, IMD3. The metal tracks of the various levels of metals M2, M3 can be electrically connected by vias V23, V34 vertically passing through the inter-metal dielectric layers IMD2, IMD3.

Moreover, the integrated circuit CI can advantageously include several electrostatic-discharge sensors SNS as described here and so that the network of antennas RANT of each sensor is located in a respective level of metal. This allows to take advantage of the information on the electrostatic discharges relative to each level of metal, and thus to be able to identify the location where the electrostatic discharges are engendered.

Moreover, the pairs of antennas AD1, AS1, AG1, AB1, AD2, AS2, AG2, AB2 respectively connected to said nodes ND1, NS1, NG1, NB1, ND2, NS2, NG2, NB2 of each pair have between them an asymmetry in shape and/or in size.

The asymmetries in shape and in size allow to create an unbalance in the phenomena generating the electrostatic discharges, and thus to amplify their consequences in the sensor SNS to be able to detect them with a greater sensitivity.

For example, for a given pair of nodes such as the nodes NG1 and NG2, the antennas AG1, AG2 connected to these nodes have an asymmetry in size in that the ratio of their surface areas is greater than or equal to ten.

According to another example, for a given pair of nodes such as the nodes ND1 and ND2, the antennas AD1, AD2 connected to these nodes have an asymmetry in shape in that one AD1 has the shape of a rake including branches adapted to run through several surface units in the respective level of metal M1, while the other has the shape of a plate AD2 only covering one surface unit in the respective level of metal M1.

The term "surface unit", thus defined by the surface occupied by the plate AD2, has a relative meaning and does not correspond to a given or set absolute size.

On the one hand, the asymmetries in shape and in size of the antennas allow to unbalance the quantity of electric charges accumulated on each of the two nodes of the corresponding pair, and thus to amplify the difference in potential between these nodes resulting from the accumulation.

It is recalled that the accumulation of electric charges can result in particular from the steps of etching in a plasma environment used during the manufacturing of the metal tracks of the levels of metals M1-M3 of the interconnection part BEOL.

On the other hand, the asymmetries in shape and in size of the antennas allow to unbalance the discharge dynamics of the nodes of the corresponding pair, following a polarization at a given voltage, and thus to amplify the difference in potentials produced during a discharge of said nodes.

It is recalled that the polarization of the nodes of the circuit at a given voltage can be provided during phases of testing and characterizing the integrated circuit, in particular according to the CDM charged device model.

These differences in potential between said nodes, thus amplified, produce electrostatic discharges, the damage of which is also amplified in the materials that form the respective link between said nodes.

Thus, the sensor SNS has an increased sensitivity and is in particular capable of detecting electrostatic discharges that can normally (that is to say without amplification) cause a deviation in the characteristics of a link without observable deterioration.

Moreover, in the semiconductor region FEOL, the various types of links between the nodes of the various pairs of the sensor SNS allow to take advantage of a multitude of measurements, which can be representative of various phenomena that generate electrostatic discharges.

The semiconductor structure SSM illustrated by FIGS. 1 and 2 is an advantageous example of a structure of the MOS (Metal Oxide Semiconductor) type allowing multiple combinations of nodes connected to respective antennas, having between them resistive, capacitive, or PN-junction links, the characteristics of which can vary according to the pair chosen.

Indeed, the semiconductor structure SSM is in this example comparable to an MOS transistor, and includes an electrically conductive bar of polycrystalline silicon G, located on the front face FA of the semiconductor substrate B, as well as two implanted regions S, D in the semiconductor substrate B.

A dielectric layer OX is further located between the bar of polycrystalline silicon G and the semiconductor substrate B, for example like a gate region and a gate oxide of an MOS transistor.

The semiconductor substrate B forms a first doped region of a first type, for example the P type, usually called body or ground in an analogous MOS transistor, and the implanted regions S, D form second doped regions of a second type opposite to the first type, for example the N type, analogous to source S and drain D regions of an MOS transistor.

Moreover, in the example illustrated, the substrate is of the silicon on insulator (SOI) type, that is to say that the substrate B in which and on which the elements of the semiconductor part FEOL are made, such as MOS transistors or the semiconductor structure SSM of the sensor SNS, is a relatively fine (thin) semiconductor layer (silicon), separated from a carrier substrate SP by a buried oxide region BOX.

This example of SOI substrate allows in particular to take advantage of a capacitive link made by the superposition of the semiconductor substrate B, of the buried oxide region BOX and of the carrier substrate SP, between two nodes of a pair.

That being said, a conventional substrate, that is to say typically a volume or bulk of crystalline silicon not including a buried oxide region BOX, is perfectly adapted to the sensor SNS.

The semiconductor structure SSM can, for example, include two nodes formed in each of the regions described above. Each node is, for example, embodied by a contact pillar CNT electrically connecting the region in question of the semiconductor part FEOL to the first level of metal M1 of the interconnection part BEOL.

Thus, the semiconductor structure SSM of the sensor SNS includes two nodes NG1, NG2, which will be called "gate nodes", contacting the bar of polycrystalline silicon G. The gate nodes NG1, NG2 can advantageously be disposed at antipodal position of the bar G, that is to say at positions maximizing the distance between the nodes NG1, NG2.

Since it is electrically conductive, the bar of polycrystalline silicon G establishes a resistive link between the two gate nodes NG1, NG2.

For example, the "bar" of polycrystalline silicon G can have a shape, viewed from the top, which is not strictly a bar (that is to say in the literal sense a rectangular profile), but for example a composition in the shape of an H having two parallel branches, to each of which one of the gate nodes NG1, NG2 is connected, and a perpendicular branch. Any other shape is also possible.

Moreover, the second doped regions S, D, which will be called source region S and drain region D, include a surface layer of a semi-metallic compound SMS, SMD, usually called "salicidation" meaning "self-aligned silicide", typically silicide of a metal such as copper or tungsten.

The semiconductor structure SSM of the sensor SNS includes two nodes ND1, ND2 contacting the drain region D, which will be called "drain nodes", which can be disposed at positions as far apart as the rules of design allow in the drain region D.

The surface layer of metallic compound SMD of the drain region D establishes a resistive link between the two drain nodes ND1, ND2.

The semiconductor structure SSM of the sensor SNS includes two nodes NS1, NS2 contacting the source region S, which will be called "source nodes".

In this particular example, the source nodes NS1, NS2 are not connected to asymmetrical antennas, but are connected to the same antenna AS, called source antenna. Consequently, the source nodes NS1, NS2 of this particular example do not form a pair of nodes in the sense of the architecture of the sensor SNS described here. That being said, the source nodes NS1, NS2, considered together, can form one of the two nodes of a pair of nodes in the sense of the architecture of the sensor SNS described here, in combination with another node connected to an antenna having an asymmetry in shape and/or in size with the source antenna AS.

For example, the set of the source nodes NS1, NS2 can form the first node of a pair of nodes having a PN junction link, with one of the drain nodes ND1, ND2, the source antenna AS having an asymmetry in shape and/or in size with the antenna connected to the drain node AD1, AD2 of the pair.

Alternatively, the source nodes NS1, NS2 can be connected to asymmetrical antennas, and thus form a pair of two nodes having a resistive link. The surface layer of semi-metallic compound SMS of the source region S establishes the resistive link between the two source nodes NS1, NS2.

Moreover, the superposition of the bar of polycrystalline silicon G, of the dielectric layer OX and of the semiconductor substrate B establishes a capacitive link between one of the gate nodes NG1, NG2 and one of the source nodes NS1, NS2 or one of the drain nodes ND1, ND2.

However, the spatially closest pairs of gate node-source node or drain node may be preferred, to avoid introducing a resistive component into the link.

For example, the pairs NG1-NS1 and NG2-ND2 can be preferred for their capacitive links.

The semiconductor structure SSM of the sensor SNS includes two nodes NB1, NB2 contacting the semiconductor substrate B, which will be called "substrate nodes".

The superposition of the bar of polycrystalline silicon G, the dielectric layer OX and the semiconductor substrate B establishes a capacitive link between one of the gate nodes NG1, NG2 and one of the substrate nodes NB1, NB2.

Here again, the spatially closest pairs of gate node-substrate node, that is to say the pairs NG1-NB1 and NG2-NB2, may be preferred.

Although this possibility is not shown, a surface layer of metal compound of the substrate B could establish a resistive link between the two substrate nodes NB1, NB2.

Finally, the interfaces between the first doped region B (substrate) and the second doped regions S, D (source and drain regions) establish PN-junction links between one of the substrate nodes NB1, NB2 and one of the source NS1, NS2 or drain ND1, ND2 nodes.

Here again, the spatially closest pairs of nodes, in particular the pairs NB1-NS1, NB1-ND1, NB2-NS2, NB2-ND2, may be preferred.

Thus, the source nodes NS1, NS2 and the drain nodes ND1, ND2 have a PN-junction link, more exactly an NPN double junction, between them.

This example of a semiconductor structure SSM of the MOS type thus has the advantage of having numerous possible combinations of pairs of two nodes having a resistive link or a capacitive link or a PN-junction link between them.

The combinations defining the pairs of nodes can be established according to various possibilities, in particular in order to parameterize the characteristics of the resistive, capacitive and PN-junction links between them.

For example, a given node can belong to a single pair of two nodes having a specific link between them; or a given node can belong to a first pair of two nodes having a first link between them (for example resistive) and to a second pair of two nodes having a second link between them (for example capacitive), and even further to a third pair of two nodes shaving a third link between them (for example PN-junction).

Moreover, the size of the semiconductor structure SSM of the sensor SNS can be chosen in such a way as to parameterize said links. For example, the length lg and the width wg of the bar of polycrystalline silicon G can be adjusted in this respect, just like the distance ds between the two source nodes NS1, NS2, and between the two drain nodes ND1, ND2.

For example, in 28 nm Fully Depleted Silicon on Insulator (FD-SOI) technology, well known to a person skilled in the art, there can be a width wg between 28 nm and 200 nm, a length lg between 100 nm and 5 μm, and a distance ds between 100 nm and 2 μm.

Figure 3:
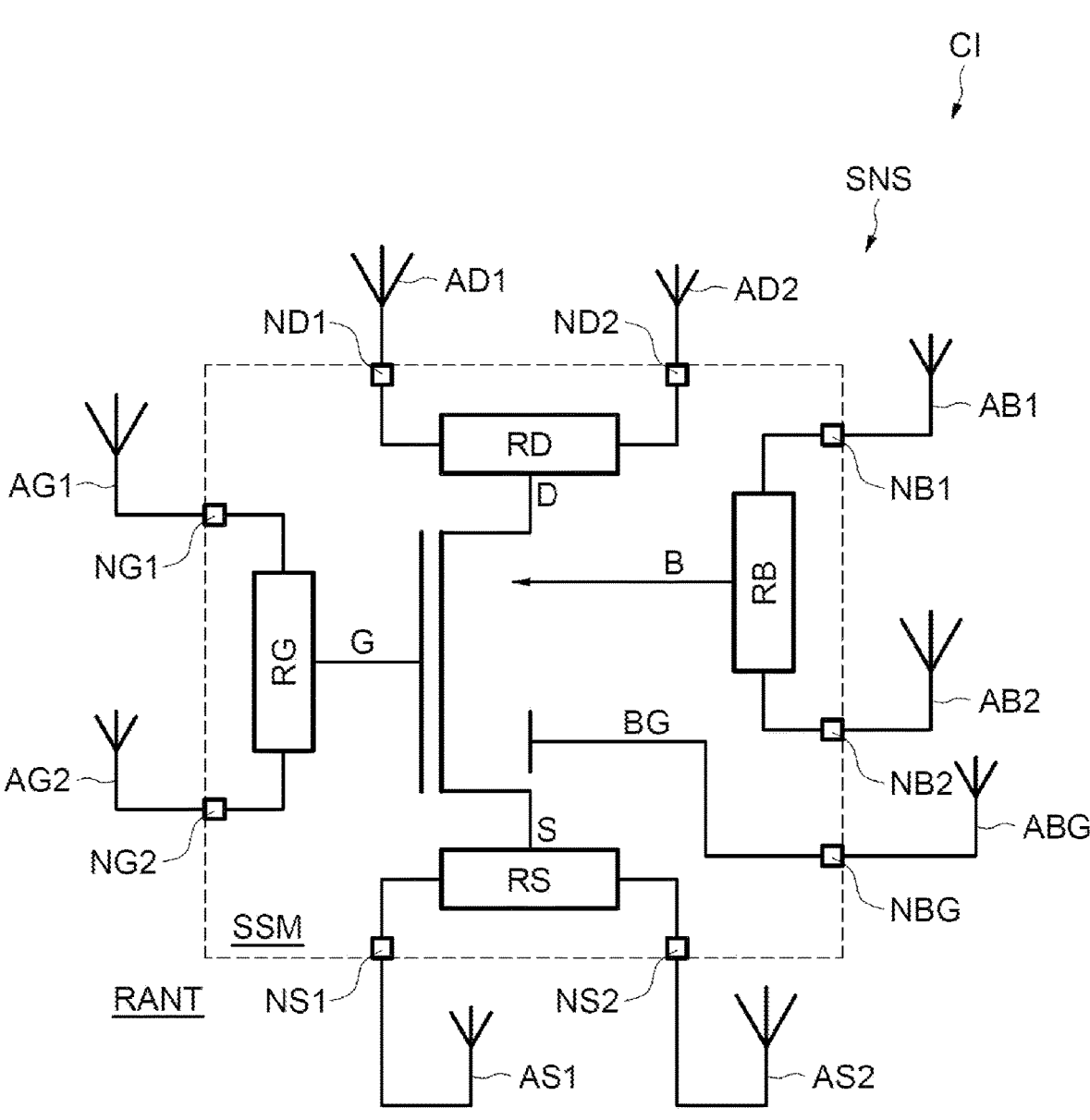
FIG. 3 is a representation of an electric circuit that can schematically show an sensor as in FIGS. 1 and 2.

FIG. 3 is a representation of an electric circuit that can schematically show a sensor SNS as described above in relation to FIGS. 1 and 2.

Indeed, the electrostatic-discharge sensor SNS includes a semiconductor structure SSM and a network of metal antennas RANT. The semiconductor structure SSM includes a conductive gate region G insulated from the semiconductor substrate B by a dielectric layer, and two doped regions S, D of the type opposite to the type of doping of the substrate B, implanted in the substrate B on either side of the part covered by the conductive gate region G. Each of said doped regions S, D of said gate region G and of said substrate B includes at least two nodes NS1, NS2, ND1, ND2, NG1, NG2, NB1, NB2 having a resistive link between them RS, RD, RG, RB in the respective region S, D, G, B. The antennas AS1, AS2, AD1, AD2, AG1, AG2, AB1, AB2 of the network of antennas RANT are coupled to said nodes, the antennas AD1, AG2 respectively coupled to at least one pair of two of said nodes NG1-NG2 having a resistive link RG having an asymmetry in shape and/or in size, the antennas AG1, AB1 respectively coupled to at least one pair of two of said nodes NG1-NB1 having a capacitive link having an asymmetry in shape and/or in size, and the antennas AD2, AS2 respectively coupled to at least one pair of two of said nodes ND2-NS2 having a PN-junction link having an asymmetry in shape and/or in size.

In the case in which the substrate B-BOX-SP (FIG. 2) is of the SOI silicon on insulator type, then the sensor can further include, among said nodes, at least one back gate node NBG connected to the carrier substrate SP (FIG. 2).

FIGS. 4 to 7 illustrate examples of links between the two nodes of "individual" pairs of an electrostatic-discharge detector, as well as an electric characteristic of the respective links.

Figure 4:
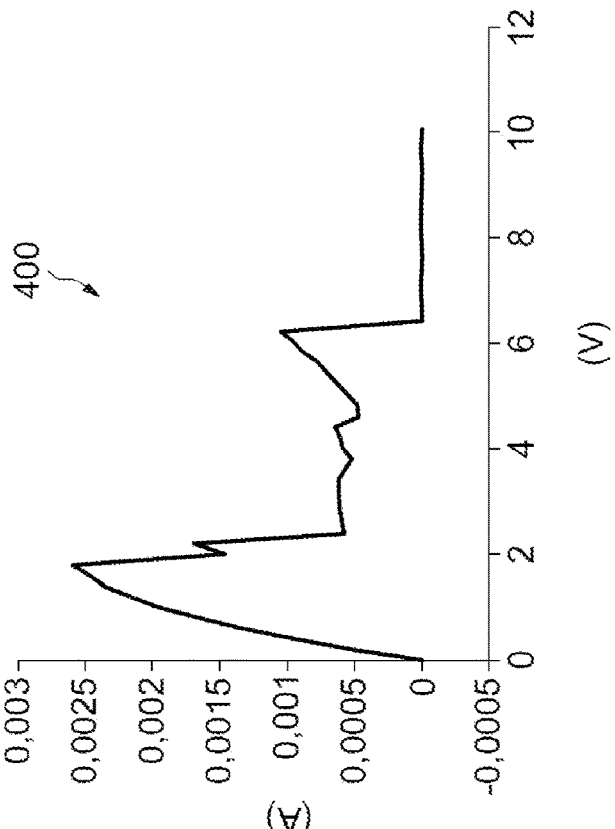
Figure 4:
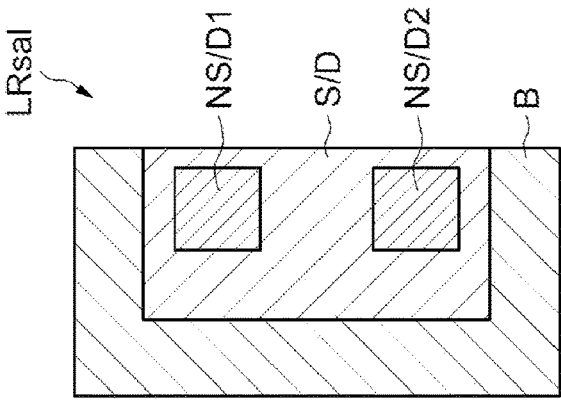
Figure 5:
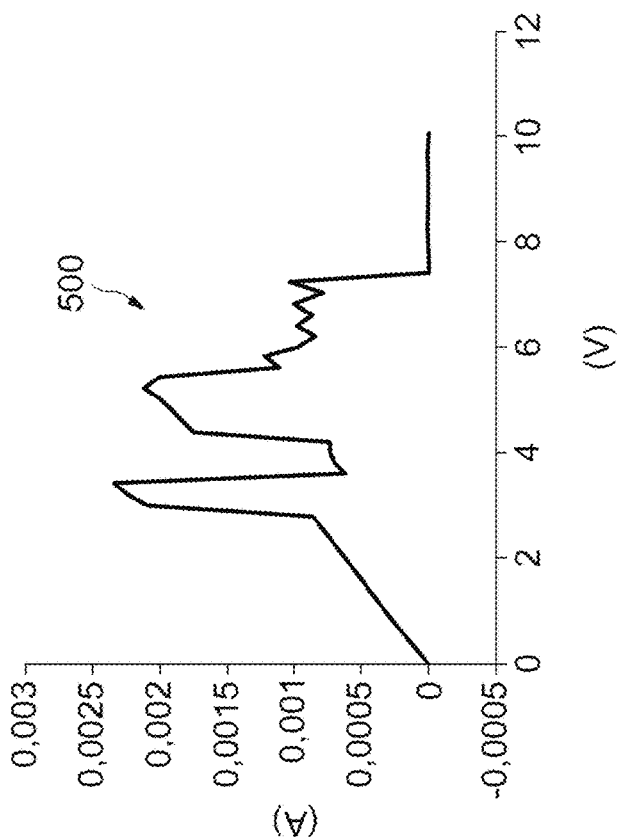
Figure 5:
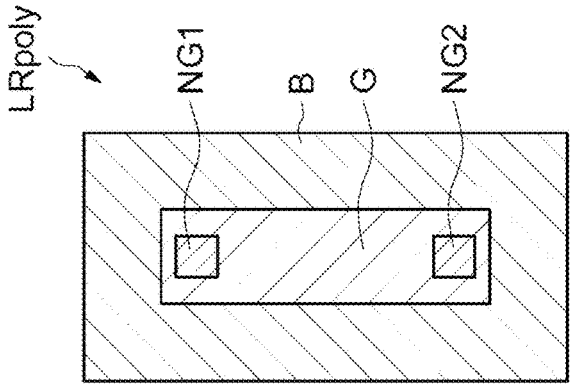
Figure 6:
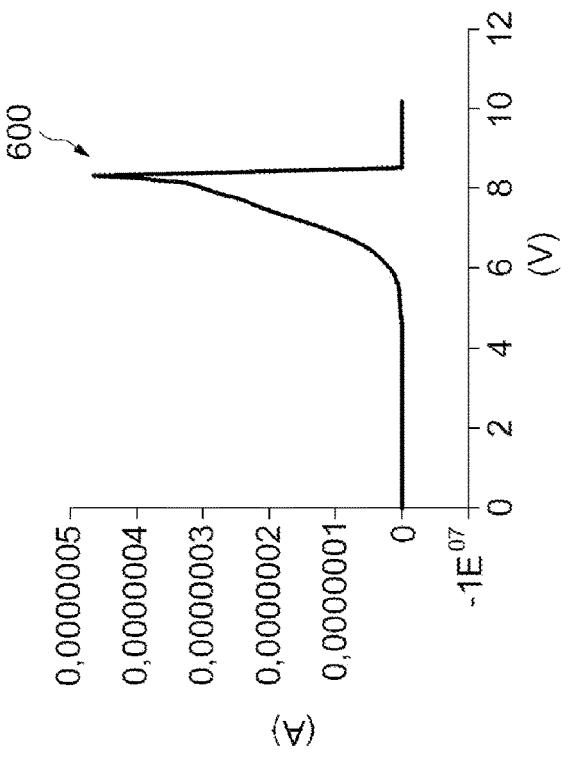
Figure 6:
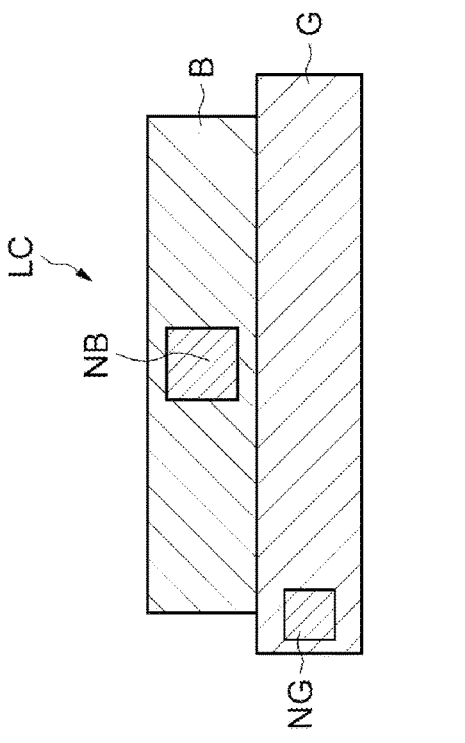

The graphs 400, 500, 600 of FIGS. 4 to 6 show the reaction of the respective link to an electric stress that is applied to it. In particular the graphs 400, 500 and 600 show the intensity of the current flowing through the link in reaction to an increasing voltage ramp.

FIG. 4 illustrates a resistive link LRsal made between the two nodes NS/D1, NS/D2 by a surface layer of a semi-metallic compound on the surface of a doped region S/D formed in the semiconductor substrate B.

The graph 400 shows the characteristic of the current (A) with respect to the voltage (V) of the link LRsal. The current/voltage ratio is substantially linear for the small voltage (V) values, until the breakdown voltage, for example slightly below 2V.

Beyond the breakdown voltage, the behavior of the link LRsal is no longer linear and does not follow a simple electric law, but can correspond to phenomena of degradation of the materials of the link. In particular, a migration of the silicide leads to an increase in the value of the resistance, up to substantially 6V, where the degradation is such that the link is broken.

FIG. 5 illustrates a resistive link LRpoly made between the two nodes NG1, NG2 by a conductive bar of polycrystalline silicon G, formed on the semiconductor substrate B.

The graph 500 represents the characteristic of the current (A) with respect to the voltage (V) of the link LRpoly.

Here again, the current/voltage ratio is substantially linear for the small voltage (V) values, until the breakdown voltage, for example substantially 3V. Beyond the breakdown voltage, the behavior of the link LRpoly is no longer linear and does not follow a simple electric law, but can correspond to phenomena of degradation of the materials of the link.

FIG. 6 illustrates a capacitive link LC made between two nodes NG, NB by a superposition of a conductive bar of polycrystalline silicon G and of a dielectric layer on the substrate B.

The graph 600 shows the characteristic of the current (A) with respect to the voltage (V) of the link LC. The intensity of the current (A) is zero until a voltage that will be called threshold voltage, at substantially 6V, then leaks of current pass through the dielectric layer, at a substantially exponential rate, until the breakdown voltage slightly greater than 8V. Beyond the breakdown voltage, the oxide is broken and the current becomes zero again because of phenomena of degradation of the materials.

FIG. 7 illustrates a PN-junction link LPN made between the two nodes NS/D, NB respectively connected to regions with opposite doping, formed in the semiconductor substrate B. One of the regions is, for example, the doped substrate B of the P type, while the doped region of the N type is an implanted region S/D in the substrate B.

The reaction of the PN-junction link LPN to an electric stress of the voltage ramp type (not shown) would correspond to a diode characteristic, that is to say, in the case of direct polarization, an exponential change starting from a threshold voltage, for example substantially located at 0.6V. Beyond the breakdown voltage, for example located between 1V and 1.8V, the behavior of the link LPN does not follow a simple electric law, but can correspond to phenomena of degradation of the materials of the link.

And, in the case of inverse polarization, the characteristic would correspond to a zero current response, or a negligible leak current, until a breakdown voltage called avalanche producing a flow of current by avalanche effect, which can also cause degradations in the materials of the link LPN.

The degradations of the link LPN can lead to a short-circuit effect, with leak currents greater by several orders of magnitude (for example leak currents of approximately one $\mu$A with respect to expected leak currents of approximately one nA during non-deteriorated operation), or, optionally according to an optional current limitation of the measurement, to an open circuit effect, that is to say a zero current.

FIG. 8 illustrates a method for detecting an electrostatic discharge 800 using the sensor SNS described above.

The detection is carried out after the manufacturing 801 of the integrated circuit CI, including a manufacturing of other elements intended for the operation of the integrated circuit, and a manufacturing of the electrostatic-discharge sensor SNS.

Advantageously, the manufacturing 801 of the electrostatic-discharge sensor SNS can be carried out simultaneously with the manufacturing 801 of other elements of the integrated circuit CI.

In particular, the manufacturing 801 of the levels of metals BEOL can comprise an exposure of the antenna network RANT to an electrically charged plasma environment. The exposure to a plasma environment is indeed capable of causing damage in the integrated circuit resulting from electrostatic discharges between the nodes of the circuit.

In the method 800, a measurement step 802 comprises a characterization of the link between the nodes of said at least one pair of the sensor SNS, and a decision step 803 comprising a comparison between the measured characterization and a nominal characteristic of the corresponding resistive, capacitive or PN-junction link.

The characterization of the link can, for example, correspond to the application of a voltage value between the nodes of the pair, and of a measurement of the current flowing between the nodes of the pair.

The characterization is, for example, carried out via a measurement device, such as an ohmmeter, exterior to the integrated circuit CI.

The nominal characteristic of the corresponding link can, for example, be defined by the behavior represented by the graph 400, 500, 600, corresponding to the link, in the voltage interval below the breakdown voltage.

For example, if the current-voltage measurement point(s) of the resistive link LRsal is (are) not on the linear part of the curve 400 between 0V and 2V, then it is detected that the link LRsal has undergone a difference in potential greater than its breakdown voltage during the manufacturing method.

For example, if the current-voltage measurement point(s) of the resistive link LRpoly is (are) not on the linear part of the curve 500 between 0V and 3V, then it is detected that the link LRpoly has undergone an electrostatic discharge greater than its breakdown voltage during the manufacturing method.

For example, if the current-voltage measurement point(s) of the capacitive link LC is (are) not on the exponential part of the curve 600 between the threshold voltage at 6V and the breakdown voltage at 8V, then it is detected that the link LC has undergone an electrostatic discharge greater than its breakdown voltage during the manufacturing method.

For example, if the current-voltage measurement point(s) of the PN-junction link LPN have a leak current greater by several orders of magnitude (for example leak currents of approximately one μA with respect to expected leak currents of approximately one nA during non-deteriorated operation) below the threshold voltage when direct and below the avalanche voltage when inverse, then it is detected that the link LPN has undergone an electrostatic discharge greater than its breakdown voltage during the manufacturing method.

Finally, the decision step 803 of the method can advantageously comprise, in the case of a divergence between the measured characterization (802) and the nominal characteristic of the corresponding link, an evaluation of damage caused in the other elements of the integrated circuit CI.

Indeed, it is possible to establish a model on the basis of the sizes of the antennas coupled to the nodes of the corresponding pair and the implementations of the other structures of the integrated circuit, which can evaluate the damage caused in the other structures of the integrated circuit with respect to the measured divergence.

Actually, it is possible to quantify the phenomenon of electrostatic discharges occurring in the sensor and to deduce from this quantification, while taking into account the amplification obtained by the asymmetry in size and/or in shape of the antennas of the respective pair, the quantification of the phenomena of electrostatic discharges occurring in the other structures of the integrated circuit.

Moreover, each of the links LRsal, LRpoly, LPN, LC described above in relation to FIGS. 4 to 7 can each form the semiconductor structure SSM of the electrostatic-discharge sensor SNS.

Indeed, although the example described above in relation to FIGS. 1 to 3 has the advantage of benefiting from numerous combinations of pairs of two nodes and of respective links, a semiconductor structure SSM only including one pair of two nodes having a single particular link between them is totally possible.

The semiconductor structure SSM of the sensor SNS can also result from any type of combination of the links LRsal, LRpoly, LPN, LC described in relation to FIGS. 4 to 7, and even of other links such as the back-gate capacitive link in a substrate of the SOI silicon on insulator type, without necessarily leading to the "complete" example described in relation to FIGS. 1 to 3.

The invention claimed is:

1. An integrated circuit, comprising:
   a semiconductor part including a semiconductor substrate;
   an interconnection part including levels of metals; and
   an electrostatic-discharge sensor including a semiconductor structure in the semiconductor part and a network of metal antennas in the interconnection part;
   the electrostatic-discharge sensor including:

at least one pair of nodes having one of a resistive link or a capacitive link or a PN-junction link in the semiconductor structure; and
   first and second antennas of the network of metal antennas respectively connected to said nodes of the at least one pair, wherein the first and second antennas have an asymmetry in one or more of shape and size, said first and second antennas being configured to generate an electrostatic-discharge in the semiconductor structure in response to antenna collection of electric charges;
   wherein said one of the resistive link or the capacitive link or the PN-junction link in the semiconductor structure exhibits a structural modification in response to sensing the electrostatic-discharge.

2. The integrated circuit according to claim 1, wherein the asymmetry in size of the first and second antennas corresponds to a ratio of their surface areas being greater than or equal to ten.

3. The integrated circuit according to claim 1, wherein the asymmetry in shape of the first and second antennas corresponds to one of the first and second antennas having a shape of a rake including branches that run through several surface units in a respective level of metal, while another one of the first and second antennas has a shape of a plate only covering one surface unit in the respective level of metal.

4. The integrated circuit according to claim 1, wherein the integrated circuit includes several electrostatic-discharge sensors, and wherein the network of antennas for each sensor is located in a respective level of metal.

5. The integrated circuit according to claim 1, wherein the semiconductor structure includes a bar of polycrystalline silicon located on a front face of the semiconductor substrate.

6. The integrated circuit according to claim 5, wherein said at least one pair of nodes includes a pair of nodes having the resistive link, wherein the bar of polycrystalline silicon forms the resistive link between the nodes of said pair.

7. The integrated circuit according to claim 5, further comprising a dielectric layer is located between the bar of polycrystalline silicon and the semiconductor substrate, wherein said at least one pair of nodes includes a pair of nodes having the capacitive link, wherein a superposition of the bar of polycrystalline silicon, the dielectric layer and the semiconductor substrate forms the capacitive link between the nodes of said pair.

8. The integrated circuit according to claim 1, wherein the semiconductor structure includes at least one doped region in the semiconductor substrate.

9. The integrated circuit according to claim 8, wherein said at least one doped region includes a surface layer made of a semi-metallic compound, wherein said at least one pair of nodes includes a pair of nodes having the resistive link, wherein the surface layer of semi-metallic compound forms the resistive link between the nodes of said pair.

10. The integrated circuit according to claim 1, wherein the semiconductor structure includes a first doped region of a first type in the semiconductor substrate and a second doped region of a second type opposite to the first type in the semiconductor substrate, wherein said at least one pair of nodes includes a pair of nodes having a PN-junction link, wherein an interface between the first doped region and the second doped region forms the PN-junction link between the nodes of said pair.

11. The integrated circuit according to claim 1, wherein the semiconductor structure includes a buried oxide region between the semiconductor substrate and a carrier substrate, wherein said at least one pair of nodes includes a pair of nodes having the capacitive link, wherein a superposition of the semiconductor substrate, the buried oxide region and the carrier substrate forms the capacitive link between the nodes of said pair.

12. A method for sensing an electrostatic discharge, comprising:

manufacturing an integrated circuit comprising an electrostatic-discharge sensor including: at least one pair of nodes having a link comprising one of a resistive link or a capacitive link or a PN-junction link in a semiconductor structure; and first and second antennas of a network of antennas respectively connected to said nodes of the at least one pair, wherein the first and second antennas have an asymmetry in one or more of shape and size; and wherein the electrostatic-discharge sensor exhibits a structural modification to said link in response to sensing an electrostatic;

measuring a characteristic of the link between the nodes of said at least one pair;

comparing the measured characteristic to a nominal characteristic of the corresponding resistive, capacitive, or PN-junction link that the electrostatic-discharge to detect said structural modification; and sensing that the electrostatic discharge has occurred in response to detection of the structural modification.

13. The method according to claim 12, wherein manufacturing comprises manufacturing the interconnection part including levels of metals wherein the network of antennas is exposed to an electrically charged plasma environment.

14. The method according to claim 12, wherein manufacturing is carried out simultaneously with manufacturing of other elements of the integrated circuit, and wherein deciding comprises, for a divergence between the measured characteristic and the nominal characteristic, evaluating the damage caused in the other elements of the integrated circuit on the basis of the divergence and the asymmetry in size and/or in shape of the first and second antennas coupled to the nodes of the at least one pair.

15. An integrated circuit, comprising:

a semiconductor substrate including at least one pair of nodes having one of a resistive link or a capacitive link or a PN-junction link;

first and second antennas formed in a plurality of metal levels over the semiconductor substrate and respectively connected to said at least one pair of nodes;

wherein the first and second antennas have an asymmetry in one or more of shape and size, said first and second antennas being configured to generate an electrostatic-discharge at said one of the resistive link or the capacitive link or the PN-junction link in response to antenna collection of electric charges;

wherein said one of the resistive link or the capacitive link or the PN-junction link forms a sensor that is structurally modified in response to the electrostatic-discharge.

16. The integrated circuit according to claim 15, further comprising a bar of polycrystalline silicon located over a front face of the semiconductor substrate and forming the resistive link between said at least one pair of nodes.

17. The integrated circuit according to claim 15, further comprising a bar of polycrystalline silicon located over a front face of the semiconductor substrate and a dielectric layer located between the bar of polycrystalline silicon and the semiconductor substrate, wherein a superposition of the bar of polycrystalline silicon, the dielectric layer and the semiconductor substrate forms the capacitive link between said at least one pair of nodes.

18. The integrated circuit according to claim 15, further comprising at least one doped region in the semiconductor substrate and a surface layer of the at least one doped region made of a semi-metallic compound, wherein the surface layer of semi-metallic compound forms the resistive link between said at least one pair of nodes.

19. The integrated circuit according to claim 15, further comprising a first doped region of a first type in the semiconductor substrate and a second doped region of a second type opposite to the first type in the semiconductor substrate, wherein an interface between the first doped region and the second doped region forms the PN-junction link between said at least one pair of nodes.

20. The integrated circuit according to claim 15, further comprising a buried oxide region between the semiconductor substrate and a carrier substrate, wherein a superposition of the semiconductor substrate, the buried oxide region and the carrier substrate forms the capacitive link between said at least one pair of nodes.

21. An integrated circuit including a sensing circuit configured to sense an electrostatic-discharge, said sensing circuit comprising:

a resistive link in a semiconductor structure;

a pair of nodes connected to the resistive link;

a first antenna connected to a first node of said pair of nodes;

a second antenna connected to a second node of said pair of nodes;

wherein the first and second antennas have an asymmetry in one or more of shape and size and are configured to collect electric charges to generate the electrostatic-discharge at the resistive link in response to the collected electric charges, said electrostatic-discharge structurally modifying the resistive link.

22. The integrated circuit of claim 21, wherein resistive link is a conductive bar made of polycrystalline silicon.

23. The integrated circuit of claim 22, wherein the conductive bar forms a gate electrode of a transistor.

24. The integrated circuit of claim 21, wherein the resistive link is a silicide layer at one of a source region or drain region of a transistor.

25. The integrated circuit of claim 21, wherein the resistive link is a body region of a transistor.

26. An integrated circuit including a sensing circuit configured to sense an electrostatic-discharge, said sensing circuit comprising:

a capacitive link in a semiconductor structure;

a pair of nodes connected to the capacitive link;

a first antenna connected to a first node of said pair of nodes;

a second antenna connected to a second node of said pair of nodes;

wherein the first and second antennas have an asymmetry in one or more of shape and size and are configured to collect electric charges to generate the electrostatic-discharge at the capacitive link in response to the collected electric charges, said electrostatic-discharge structurally modifying the capacitive link.

27. The integrated circuit of claim 26, wherein the capacitive link is formed by a gate region and a body region of a transistor.

28. The integrated circuit of claim 27, wherein gate region is a back gate of the transistor.

29. An integrated circuit including a sensing circuit configured to sense an electrostatic-discharge, said sensing circuit comprising:

a PN junction link in a semiconductor structure;

a pair of nodes connected to the capacitive link;

a first antenna connected to a first node of said pair of nodes;

a second antenna connected to a second node of said pair of nodes;

wherein the first and second antennas have an asymmetry in one or more of shape and size and are configured to collect electric charges to generate the electrostatic-discharge at the PN junction link in response to the collected electric charges, said electrostatic-discharge structurally modifying the PN junction link.

30. The integrated circuit of claim 29, wherein the PN junction link is formed by a source region and body region of a transistor.

31. The integrated circuit of claim 29, wherein the PN junction link is formed by a drain region and body region of a transistor.

\* \* \* \* \*